US011757220B2

(12) United States Patent
Farkas et al.

(10) Patent No.: US 11,757,220 B2
(45) Date of Patent: Sep. 12, 2023

(54) PADDLE CARD FOR CROSSTALK CANCELLATION IN HIGH-SPEED SIGNALING

(71) Applicant: DELL PRODUCTS, LP, Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 184 days.

(21) Appl. No.: 17/443,719

(22) Filed: Jul. 27, 2021

(65) Prior Publication Data

US 2023/0032371 A1    Feb. 2, 2023

(51) Int. Cl.
| | |
|---|---|
| *H01R 12/72* | (2011.01) |
| *H05K 3/32* | (2006.01) |
| *H01R 12/57* | (2011.01) |
| *H05K 1/11* | (2006.01) |
| *H01R 12/59* | (2011.01) |

(52) U.S. Cl.
CPC .......... *H01R 12/721* (2013.01); *H01R 12/57* (2013.01); *H01R 12/596* (2013.01); *H05K 1/117* (2013.01); *H05K 3/32* (2013.01); *H05K 2201/09809* (2013.01)

(58) Field of Classification Search
CPC .......... H01R 12/53; H01R 12/57; H05K 3/32
See application file for complete search history.

(56) References Cited

U.S. PATENT DOCUMENTS

| | | | |
|---|---|---|---|
| 9,466,925 B2 | 10/2016 | Rost et al. | |
| 10,249,988 B2 | 4/2019 | Craton | |
| 2013/0264107 A1* | 10/2013 | Meyers | H01R 13/6466 174/268 |

\* cited by examiner

*Primary Examiner* — Jeremy C Norris
(74) *Attorney, Agent, or Firm* — Larson Newman, LLP

(57) ABSTRACT

A paddle card includes a printed circuit board and a twin-axial cable. The PCB includes a first signal pad on a top surface of the PCB and a second signal pad on a bottom surface of the PCB. The second signal pad is directly below the first signal pad. The twin-axial cable includes a first signal conductor coupled to the first signal pad and a second signal conductor coupled to the second signal pad.

20 Claims, 4 Drawing Sheets

PADDLE CARD FOR CROSSTALK CANCELLATION IN HIGH-SPEED SIGNALING

FIELD OF THE DISCLOSURE

This disclosure generally relates to information handling systems, and more particularly relates to a paddle card design for crosstalk cancellation in high-speed signaling in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A paddle card may include a printed circuit board and a twin-axial cable. The PCB may include a first signal pad on a top surface of the PCB and a second signal pad on a bottom surface of the PCB. The second signal pad may be directly below the first signal pad. The twin-axial cable may include a first signal conductor coupled to the first signal pad and a second signal conductor coupled to the second signal pad.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
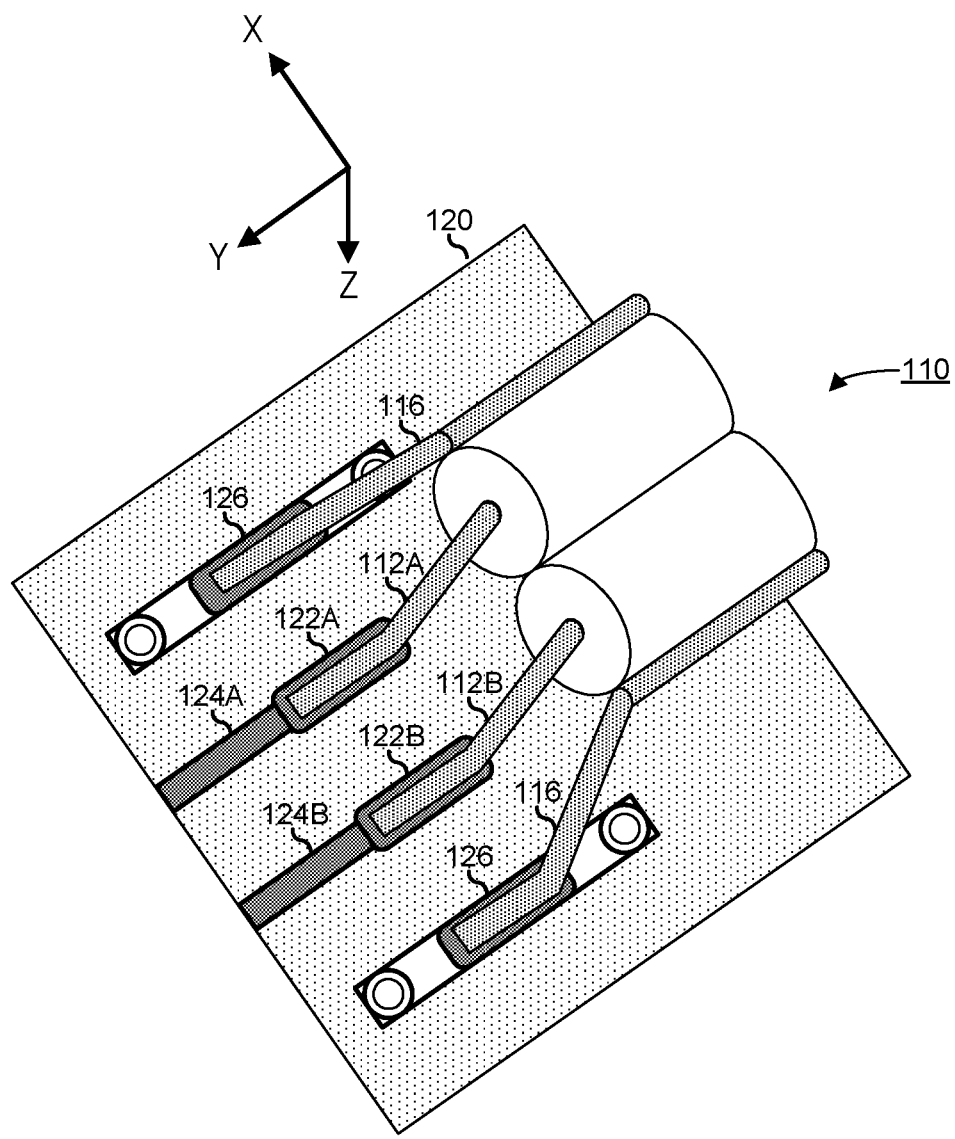
FIG. 1 illustrates a paddle card according to the prior art.

FIG. 1 illustrates an oblique view of a paddle card 100 with a twin-axial (twinax) cable 110 that is hot-bar soldered to a printed circuit board (PCB) 120. Paddle card 100 represents a device that is used to adapt a signal from one physical form of transmission to a different form. For example, a paddle card my typically include a card edge connector adapted to be inserted into a card edge connector that is itself affixed to a mother board or add-in card. The paddle card may then include traces that route the various power, ground, and signal circuits to pads on an outer surface of the paddle card PCB. Various types of cables can then be affixed to the pads. In this way, the signals associated with the motherboard or add-in card are adapted from the fixed form as found on the traces and devices of the motherboard or add-in card, to a flexible form that can be more easily routed within an information handling system to other devices which utilize the signals. Here, while the illustration of FIG. 1 is of paddle card 100, the teachings of the current disclosure are not limited to paddle cards in general, but will be understood to apply equally to other types of PCB-edge cable connections, such as where a mother board or add-in card itself includes an edge-connected cable.

Twinax cable 110 includes two signal conductors 112A and 112B, and two drain conductors 116. PCB 120 includes two signal pads 122A and 122B connected to two signal traces 124A and 124B, and two guard trace structures 126. Signal conductors 112A and 112B are hot-bar soldered to respective signal pads 122A and 122B, and drain conductors 126 are each hot-bar soldered to an adjacent one of guard trace structures 126. Paddle card 100 is typical of many different configurations for generalized twinax cable connections to paddle cards. For example, as illustrated, twinax cable 110 has signal conductors 112 and drain conductors arranged on a common axis, but this is not necessarily so. Other types of twinax cable may place two drain conductors on an axis perpendicular to the axis of the signal conductors, and located between the signal conductors. Other types of twinax cables may include only one drain conductor, or may include individual drain shield mesh conductors around the signal conductors, as needed or desired. The details of twinax cable construction, paddle card PCB fabrication, and paddle card assembly are known in the art and will not be further disclosed herein, except as needed to illustrate the current embodiments.

The signals carried by twinax cable 110 are typically signals that are susceptible to interference from outside sources, such as crosstalk from adjacent signals. As such, power and ground circuits are not typically provided over twinax cables due to the higher cost of twinax cables. As such, twinax cables are typically associated with various high-speed data communication interfaces. Examples of a high-speed data communication interface may include a PCI-Express (PCIe) interface such as a ×4, ×8, or ×16 PCIe interface, an Accelerated Graphics Port (AGP) interface, a Serial ATA interface, a network interface such as an Ethernet interface, a Fibre Channel interface, or the like, a proprietary interface, another high-speed interface, or the like. Such high-speed data communication interfaces may be double-ended data communication interfaces, where data is transmitted over a pair of signal conductors and data is communicated as a differential signal between the pair of conductors.

Here, where paddle card 100 is associated with a double-ended data communication interface, signal conductors 112A and 112B will be understood to carry one doubled-ended differential signal. Paddle card 100 may further include one or more additional twinax cables similar to twinax cable 110, and to include associated signal pads and guard trace structures, as needed or desired. For example, where paddle card 100 represents an eight lane (×8) PCIe paddle card, the paddle card may be understood to include eight (8) twinax cables and the associated signal pads and guard trace structures.

The inventors of the current disclosure have understood that the challenges of successfully routing high-speed data communication interfaces is increasing as the speeds of such interfaces increases. In particular, a typical high-speed data communication interface specification will have similar circuit loss requirements across the speed spectrum, and the maximum transmission distances stay constant or are increasing, while the specifications for susceptibility to crosstalk and reflections in the circuit path are becoming tighter.

The use of paddle cards and cabling has helped to meet some of the challenges, while introducing new challenges. A circuit architecture that includes paddle cards and cabling typically adds connectors at each end, leading to increased loss and reflections. Moreover, the signal pads needed for cross-bar soldering are typically large and act as radiators of the conducted signals, thus making the signals more susceptible to crosstalk from adjacent signal pads. The use of guard traces between the signal pads may offset the crosstalk problem somewhat, but there remains a need for designs that further reduce the susceptibility of high-speed data communication interfaces to crosstalk.

Figure 2:
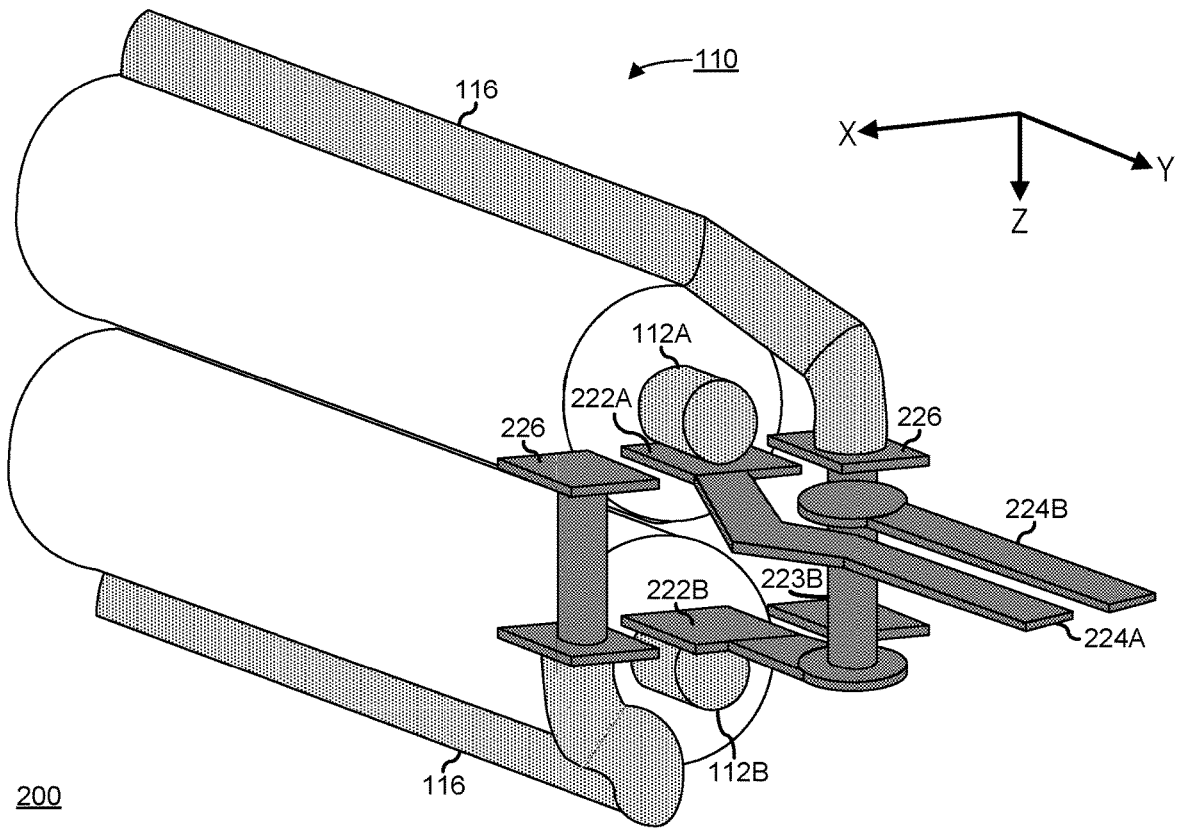
FIG. 2 illustrates a paddle card according to an embodiment of the current disclosure.
Figure 2:
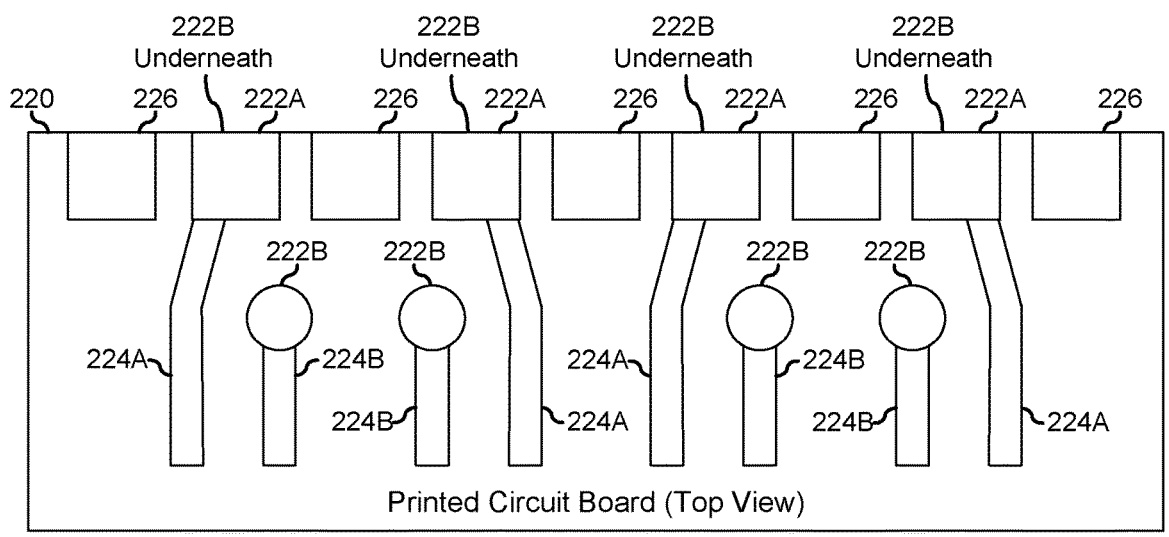

FIG. 2 illustrates a paddle card 200 according to an embodiment of the current disclosure, including twinax cable 110 and a PCB 220. A top image of FIG. 1 shows an oblique view of paddle card 200 without showing PCB 220 for simplicity of illustration, while a bottom image shows a top view of PCB 220 without twinax cable 110 for simplicity of illustration. However, is will be understood that PCB 220 is included in the top image, and that twinax cable 110 is included in the bottom image. Functionally, paddle card 200 is similar to paddle card 100, representing a device to adapt the fixed signal traces associated with a motherboard or add-in card to a flexible form that can be more easily routed within an information handling system. However, as with FIG. 1, the teachings of the current disclosure are not limited to paddle cards in general, but will be understood to apply equally to other types of PCB-edge cable connections, such as where a mother board or add-in card itself includes an edge-connected cable.

PCB 220 includes two signal pads 222A and 222B connected to two signal traces 224A and 224B, and two ground pad structures 226. Here, signal pad 222A is on a top surface of PCB 220, and signal pad 222B is on a bottom surface of the PCB, while both signal traces 224A and 224B are on the top surface of PCB 220. As such, signal pad 222B is connected to signal trace 222B via a through-hole via 223B that provides an electrical circuit path between the signal pad on the bottom side and the signal trace on the top side. Here, twinax cable 110 is oriented with respect to PCB 210 perpendicularly to the twinax cable is oriented with respect to PCB 110, and signal conductor 112A is connected to signal pad 222A on the top surface of PCB 210, while signal conductor 112B is connected to signal pad 222B on the bottom surface of PCB 210. Signal conductors 112A and 112B may be hot-bar soldered to respective signal pads 222A and 222B, or may be connected by another solder process, as needed or desired.

Ground pad structures 226 each include a pad on the top surface of PCB 210, a pad on the bottom surface of the PCB, and a through-hole via that connects the top surface pad to the bottom surface pad. In a particular embodiment one or more of ground pad structures 226 are connected to a ground plane of PCB 210, as needed or desired. Finally, a first one of drain conductors 116 is connected to the top surface pad of a first one of ground pad structures 226, and the second one of the drain conductors is connected to the bottom surface pad of the second ground pad structure. Drain conductors 126 may be hot-bar soldered to their respective ground pad structures 226, or may be connected by another solder process, as needed or desired.

The signals carried by twinax cable 110 may be associated with a double-ended data communication interface, and signal conductors 112A and 112B may each be understood to carry one side of the doubled-ended differential signal. Paddle card 200 may be further understood to include one or more additional twinax cables similar to twinax cable 110, and to include associated signal pads and ground pad structures, as needed or desired. For example, where paddle card 200 represents an eight lane (×8) PCIe paddle card, the paddle card may be understood to include eight (8) twinax cables and the associated signal pads and ground pad structures. In the case of multiple twinax cables, the configuration illustrated by paddle card 200 will result in a more compact arrangement of the twinax cables.

For example, considering a paddle card for adapting to four (4) twinax cables, the design associated with paddle card 100 would necessitate a width in the X axis sufficient to accommodate 13 pads (8× signal pads and 5× guard trace pads). In contrast, the design associated with paddle card 200 would only necessitate a width in the X axis sufficient to accommodate 9 pads (4× signal pads, with the other 4× signal pads being located on the bottom side, and 5× guard trace pads). The bottom image of FIG. 2 shows the top view of PCB 220 for such an exemplary system with four signal pads 222A (with the four signal pads 222B underneath them), and with five ground pad structures 226.

Additionally, the bottom image of FIG. 2 shows where every other pair of signal pads 222A and 222B are swapped in their orientation of the associated signal traces 224A and 224B. Thus, here, starting at the left side of PCB 220, for a first differential signal pair, a first signal pad 222A on the top side of the PCB connects to a first signal trace 224A, and a first signal pad 222B on the bottom side of the PCB connects to a second signal trace 224B, and the first signal trace 222A is routed to the left hand side of the second signal trace 222B. Then, for a second differential signal pair, the first signal pad 222A on the top side of the PCB again connects to the first signal trace 224A, and the first signal pad 222B on the bottom side of the PCB connects to the second signal trace 224B, but the first signal trace 222A is routed to the right hand side of the second signal trace 222B. Next, for a third differential signal pair, the pattern of the first differential signal pair is repeated with the first signal trace 222A being routed to the left hand side of the second signal trace 222B. Finally for the fourth differential signal pair, the pattern of the second differential signal pair is repeated with the first signal trace 222A being routed to the right hand side of the second signal trace 222B. In this way, each adjacent pair of signal traces is subject to crosstalk induced into a first lane of the differential pair that is cancelled out in the second lane of the differential pair due to the crossover of lanes.

Figure 3:
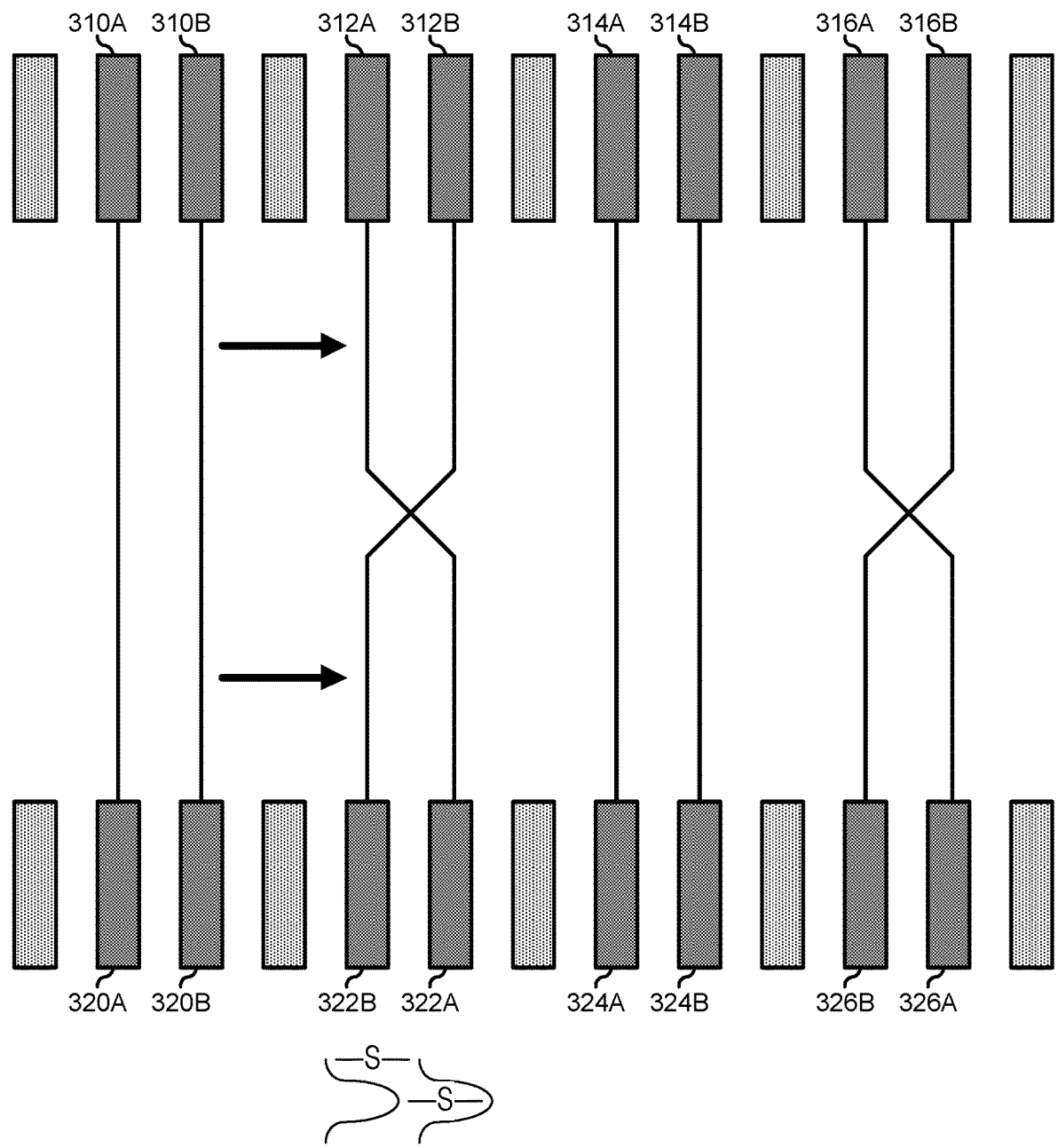
FIG. 3 is a schematic representation of the paddle card of FIG. 2.

FIG. 3 illustrates schematically a configuration of four double-ended differential signal pairs 300. Here, at a first component side, four differential signal pairs 310, 312, 314, and 316 are routed as illustrated by PCB 220, and the a second component side receives four differential signal pairs 320, 322, 324, and 326. In particular, a first differential signal pair 310A and 310B are directly routed to a first differential signal pair 320A and 320B. Then a second differential signal pair 312A and 312B are routed with a crossover to a second differential signal pair 322A and 322B. Next, a third differential signal pair 314A and 314B are directly routed to a third differential signal pair 324A and 324B. Finally, a fourth differential signal pair 312A and 316B are routed with a crossover to a fourth differential signal pair 326A and 326B. Consider a case where signal lane 310B is an aggressor into differential signal pair 312A and 312B. Here, due to the crossover routing, crosstalk induced into signal lane 312A is also induced into signal lane 312B, and the differential signal (S) between signal lanes 322A and 322B remains constant, thus reducing the impact of the induced crosstalk.

Figure 4:
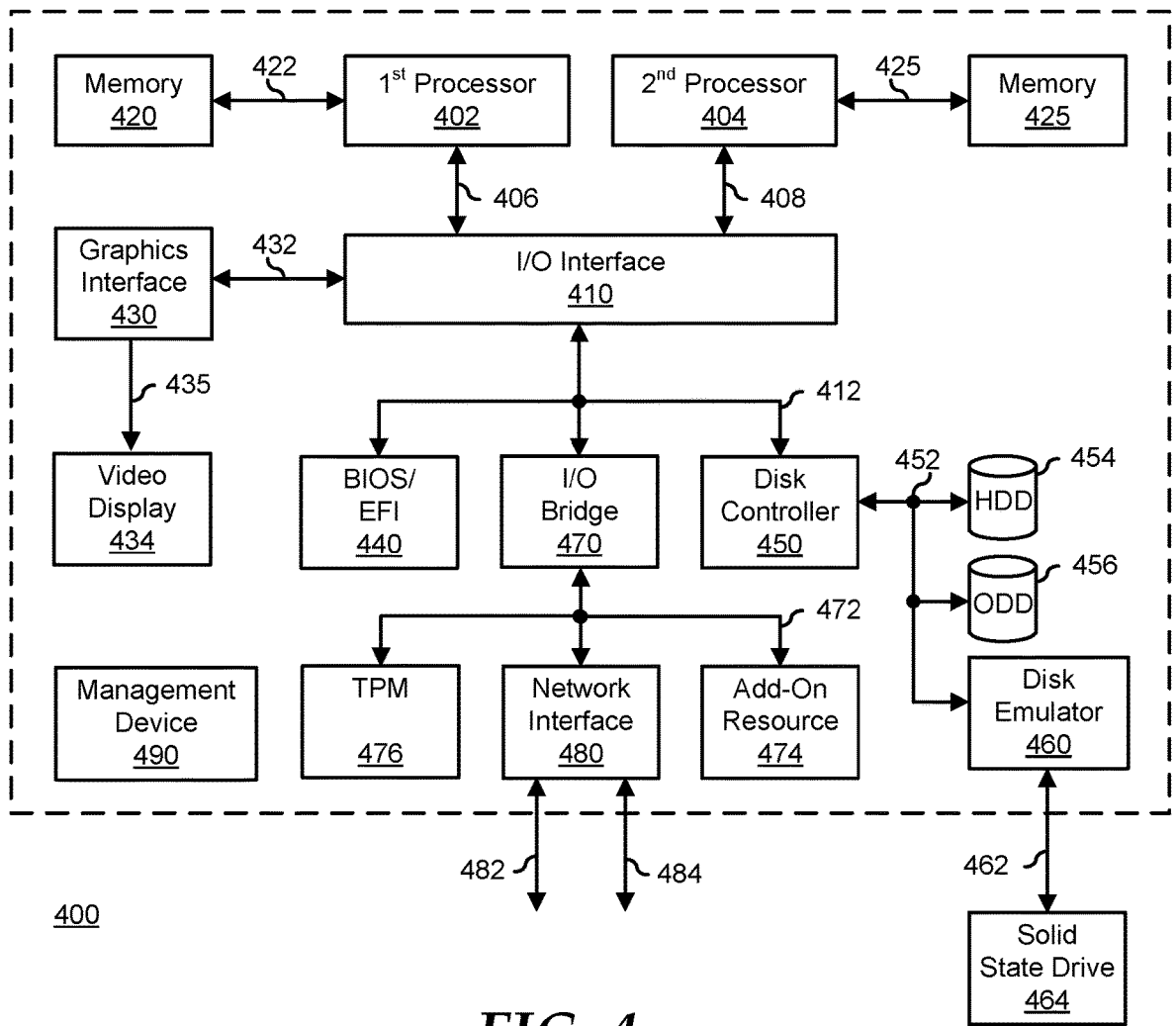
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, and a management device 490. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 435 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A paddle card, comprising:
    a printed circuit board (PCB) including a first signal pad on a top surface of the PCB and a second signal pad on a bottom surface of the PCB, the second signal pad being directly below the first signal pad; and
    a first twin-axial cable including a first signal conductor coupled to the first signal pad and a second signal conductor coupled to the second signal pad.

2. The paddle card of claim 1, wherein the PCB further includes a first guard trace having a first guard trace pad on the top surface and a second guard trace pad on the bottom surface, wherein the first and second guard trace pads are coupled together by a first through-hole via.

3. The paddle card of claim 2, wherein the first twin-axial cable further includes a first drain conductor coupled to one of the first guard trace pad and the second guard trace pad.

4. The paddle card of claim 3, wherein the PCB further includes a second guard trace having a third guard trace pad on the top surface and a fourth guard trace pad on the bottom surface, wherein the first and second guard trace pads are coupled together by a second through-hole via.

5. The paddle card of claim 4, wherein:
    the first twin-axial cable further includes a second drain conductor;
    when the first drain conductor is coupled to the first guard trace pad, the second drain conductor is coupled to the fourth guard trace pad; and
    when the first drain conductor is coupled to the second guard trace pad, the second drain conductor is coupled to the third guard trace pad.

6. The paddle card of claim 2, wherein the first through-hole via is coupled to a ground plane layer of the PCB.

7. The paddle card of claim 2, wherein the first drain conductor is hot-barwi soldered to the selected one of the first guard trace pad and the second guard trace pad.

8. The paddle card of claim 1, wherein:
    the PCB further includes a first signal trace on the top surface and a second signal trace on the top surface;

the first signal trace is coupled to the first signal pad; and
the second signal trace is coupled to the second signal pad by a through-hole via.

9. The paddle card of claim 8, wherein the first signal conductor, the first signal pad, and the first signal trace carry a first side of a double-ended differential signal, and wherein the second signal conductor, the second signal pad, and the second signal trace carry a second side of the double-ended differential signal.

10. The paddle card of claim 1, wherein the first signal conductor is hot-bar soldered to the first signal pad and the second signal conductor is hot-bar soldered to the second signal pad.

11. A paddle card, comprising:
a printed circuit board (PCB) including a first signal pad on a top surface of the PCB, a second signal pad on a bottom surface of the PCB, a third signal pad on the top surface, a fourth signal pad on the bottom surface, a first signal trace on the top surface coupled to the first signal pad, a second signal trace on the top surface coupled to the second signal pad by a first through-hole via, a third signal trace on the top surface coupled to the third signal pad, and a fourth signal trace on the top surface coupled to the fourth signal pad by a second through-hole via, wherein the second signal pad is directly below the first signal pad and the fourth signal pad is directly below the third signal pad;
a first twin-axial cable including a first signal conductor coupled to the first signal pad and a second signal conductor coupled to the second signal pad; and
a second twin-axial cable including a third signal conductor coupled to the third signal pad and a fourth signal conductor coupled to the fourth signal pad;
wherein the second signal trace is adjacent to the fourth signal trace.

12. A method of forming a paddle card, the method comprising:
forming, on a top surface of a printed circuit board (PCB), a first signal pad;
forming, on a bottom surface of the PCB, a second signal pad, the second signal pad being directly below the first signal pad;
coupling a first signal conductor of a first twin-axial cable to the first signal pad; and
coupling a second signal conductor of the first twin-axial cable to the second signal pad.

13. The method of claim 12, further comprising:
forming, on the top surface, a first guard trace pad;
forming, on the bottom surface, a second guard trace pad;
coupling the first guard trace pad to the second guard trace pad by a first through-hole via.

14. The method of claim 13, further comprising:
coupling a first drain conductor of the twin-axial cable to one of the first guard trace pad and the second guard trace pad.

15. The method of claim 14, further comprising:
forming, on the top surface, a third guard trace pad;
forming, on the bottom surface, a fourth guard trace pad;
coupling the third guard trace pad to the fourth guard trace pad by a second through-hole via.

16. The method of claim 15, wherein the first twin-axial cable further includes a second drain conductor, the method further comprising:
when the first drain conductor is coupled to the first guard trace contact, coupling the second drain conductor to the fourth guard trace contact; and
when the first drain conductor is coupled to the second guard trace contact, coupling the second drain conductor to the third guard trace contact.

17. The method of claim 13, further comprising:
coupling the first through-hole via to a ground plane layer of the PCB.

18. The method of claim 13, wherein the first drain conductor is hot-bar soldered to the selected one of the first guard trace pad and the second guard trace pad.

19. The method of claim 12, further comprising:
forming, on the top surface, a first signal trace and a second signal;
coupling the first signal trace to the first signal pad; and
coupling the second signal trace to the second signal pad by a through-hole via.

20. The method of claim 19, wherein the first signal conductor, the first signal pad, and the first signal trace carry a first side of a double-ended differential signal, and wherein the second signal conductor, the second signal pad, and the second signal trace carry a second side of the double-ended differential signal.

* * * * *